United States Patent
Fukuzawa

(10) Patent No.: US 9,537,448 B2
(45) Date of Patent: Jan. 3, 2017

(54) OSCILLATOR, ELECTRONIC APPARATUS, AND MOVING OBJECT

(71) Applicant: Seiko Epson Corporation, Tokyo (JP)

(72) Inventor: Akihiro Fukuzawa, Hino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/013,160

(22) Filed: Feb. 2, 2016

(65) Prior Publication Data
US 2016/0226446 A1  Aug. 4, 2016

(30) Foreign Application Priority Data
Feb. 4, 2015  (JP) ................................. 2015-020197

(51) Int. Cl.
*H03B 5/32* (2006.01)
*H03B 5/12* (2006.01)

(52) U.S. Cl.
CPC ............... *H03B 5/32* (2013.01); *H03B 5/124* (2013.01); *H03B 2200/0092* (2013.01); *H03L 2207/05* (2013.01)

(58) Field of Classification Search
CPC ............. H03B 1/04; H03B 5/04; H03B 5/124; H03B 5/1243; H03B 5/30; H03B 5/32; H03B 2200/0092; H03L 1/02; H03L 1/021; H03L 1/022; H03L 1/023; H03L 1/025; H03L 1/026; H03L 1/028; H03L 2207/05
USPC .... 331/36 C, 44, 105, 154, 158, 175, 177 V; 332/124
See application file for complete search history.

(56) References Cited

U.S. PATENT DOCUMENTS

| | | | | |
|---|---|---|---|---|
| 3,569,867 A | * | 3/1971 | Ernst | H03F 3/45479 327/101 |
| 3,628,134 A | * | 12/1971 | Andersen | G01R 29/06 324/619 |
| 4,129,832 A | * | 12/1978 | Neal | H03B 23/00 327/101 |
| 4,499,435 A | * | 2/1985 | Thomson | H03B 23/00 331/178 |
| 4,646,035 A | * | 2/1987 | Chapelle | H03L 1/025 331/176 |
| 4,675,618 A | * | 6/1987 | Cross | H03C 3/08 332/124 |
| 4,922,212 A | * | 5/1990 | Roberts | H03L 1/026 331/158 |
| 5,548,252 A | * | 8/1996 | Watanabe | H03L 1/025 331/116 FE |
| 5,557,241 A | * | 9/1996 | Burke | H03B 23/00 327/132 |

(Continued)

FOREIGN PATENT DOCUMENTS

JP   10-215120 A   8/1998

*Primary Examiner* — Levi Gannon
(74) *Attorney, Agent, or Firm* — Harness, Dickey & Pierce, P.L.C.

(57) ABSTRACT

An oscillator includes: an oscillation circuit whose oscillation frequency changes based on a voltage that is applied to a variable capacitance element; and a voltage generation unit that generates the voltage which is applied to the variable capacitance element based on a control signal, in which the voltage that is generated by the voltage generation unit changes nonlinearly with respect to a change in the control signal such that a change in the oscillation frequency with respect to the change in the control signal is adjusted to come close to be linear.

16 Claims, 12 Drawing Sheets

(56) References Cited

U.S. PATENT DOCUMENTS

| | | | | |
|---|---|---|---|---|
| 6,081,163 | A * | 6/2000 | Ujiie | G01S 19/235 331/11 |
| 6,342,798 | B1 * | 1/2002 | Yoshida | H03L 1/026 327/156 |
| 8,878,615 | B2 * | 11/2014 | Wu | H03L 7/00 331/105 |
| 2009/0079507 | A1 * | 3/2009 | Kato | H03L 7/085 331/44 |

* cited by examiner

OSCILLATOR, ELECTRONIC APPARATUS, AND MOVING OBJECT

BACKGROUND

1. Technical Field

The present invention relates to an oscillator, an electronic apparatus, and a moving object.

2. Related Art

JP-A-10-215120 discloses that, in a voltage control oscillator, because a change in capacitance of a variable capacitance diode (varicap) is nonlinear with respect to a voltage that is applied between terminals, the voltage that is applied between the terminals of the variable capacity diode is limited to a range in which the change in the capacitance is good in linearity, by performing voltage division of a control voltage using a resistor, and thus an oscillation frequency can be variable in a linear manner.

However, in the oscillator disclosed in JP-A-10-215120, because the voltage that is applied between the terminals of the variable capacitance diode is limited to the range in which the change in the capacitance is good in linearity, there is a problem in that a frequency variable range is limited.

SUMMARY

An advantage of some aspects of the invention is to provide an oscillator that is capable of broadening a frequency variable range. Another advantage of some aspects of the invention is to provide an electronic apparatus and a moving object that use the oscillator.

The invention can be implemented as the following forms or application examples.

Application Example 1

An oscillator according to this application example includes: an oscillation circuit that includes a variable capacitance element and whose oscillation frequency changes based on a voltage that is applied to the variable capacitance element; and a voltage generation unit that generates the voltage which is applied to the variable capacitance element based on a control signal, in which the voltage that is generated by the voltage generation unit changes nonlinearly with respect to a change in the control signal such that a change in the oscillation frequency with respect to the change in the control signal is adjusted to come close to be linear.

According to the oscillator of the application example, because the voltage generation unit generates the voltage that changes nonlinearly with respect to the change in the control signal such that the change in the oscillation frequency with respect to the change in the control signal is adjusted to come close to be linear, a region where capacitance of the variable capacitance element changes nonlinearly can also be used, and a frequency variable range can be broadened.

Application Example 2

In the oscillator according to the application example, the control signal may be a digital signal, and the voltage generation unit may include a D/A conversion circuit.

Application Example 3

In the oscillator according to the application example, an output voltage of the D/A conversion circuit may change nonlinearly with respect to a change in an input signal.

According to the oscillator of the application example, because the change in the oscillation frequency with respect to the change in the control signal is adjusted to come close to be linear by the D/A conversion circuit whose input and output characteristic is nonlinear, a region where the capacitance of the variable capacitance element changes nonlinearly can also be used, and the variable range of the frequency can be broadened.

Application Example 4

In the oscillator according to the application example, an output voltage of the D/A conversion circuit changes linearly with respect to a change in an input signal, and the voltage generation unit may include a signal conversion unit that converts the control signal into a signal that changes nonlinearly with respect to the change in the control signal and outputs the signal to the D/A conversion circuit.

According to the oscillator of the application example, because the input signal to the D/A conversion circuit whose input and output characteristic is linear changes nonlinearly with respect to the change in the control signal such that the change in the oscillation frequency with respect to the change in the control signal is adjusted to come close to be linear, a region where the capacitance of the variable capacitance element changes nonlinearly can also be used, and the variable range of the frequency can be broadened.

Application Example 5

In the oscillator according to the application example, the signal conversion unit may convert the control signal into the signal that changes nonlinearly, using a lookup table.

Application Example 6

In the oscillator according to the application example, the control signal may be an analog signal, and the voltage generation unit may include an A/D conversion circuit that converts the control signal into a digital signal, and a D/A conversion circuit that converts the digital signal converted by the A/D conversion circuit into the voltage that is applied to the variable capacitance element.

Application Example 7

In the oscillator according to the application example, the A/D conversion circuit may convert the control signal into the digital signal that changes nonlinearly with respect to the control signal.

According to the oscillator of the application example, because the change in the oscillation frequency with respect to the change in the control signal is adjusted to come close to be linear by the A/D conversion circuit whose input and output characteristic is nonlinearity, a region where the capacitance of the variable capacitance element changes nonlinearly can also be used, and the variable range of the frequency can be broadened.

Application Example 8

In the oscillator according to the application example, the D/A conversion circuit may convert the digital signal converted by the A/D conversion circuit into the voltage that changes nonlinearly with respect to the change in the digital signal.

According to the oscillator of the application example, because the change in the oscillation frequency with respect to the change in the control signal is adjusted to come close to be linear by the D/A conversion circuit whose input and output characteristic is nonlinear, a region where the capacitance of the variable capacitance element changes nonlinearly can also be used, and the variable range of the frequency can be broadened.

Application Example 9

An electronic apparatus according to this application example includes the oscillator according to any one of the application examples.

Application Example 10

A moving object according to this application example includes the oscillator according to any one of the application examples.

According to these application examples, because the oscillator whose frequency variable range can be broadened is used, for example, a high-reliability electronic apparatus and a moving object can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Suitable embodiments of the invention will be described in detail below. Moreover, the embodiments that will be described below do not unjustly impose any limitation on contents of the invention that are described in the appended claims. Furthermore, all configurations that will be described below are not necessarily essential requirements for the invention.

1. Oscillator 1-1. First Embodiment

Figure 1:
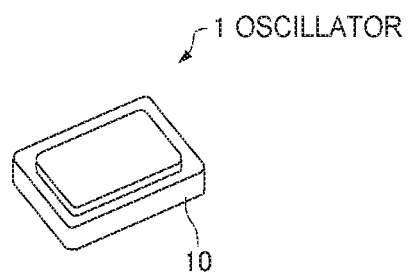
FIG. 1 is a perspective diagram illustrating an oscillator according to the present embodiment.
Figure 2:
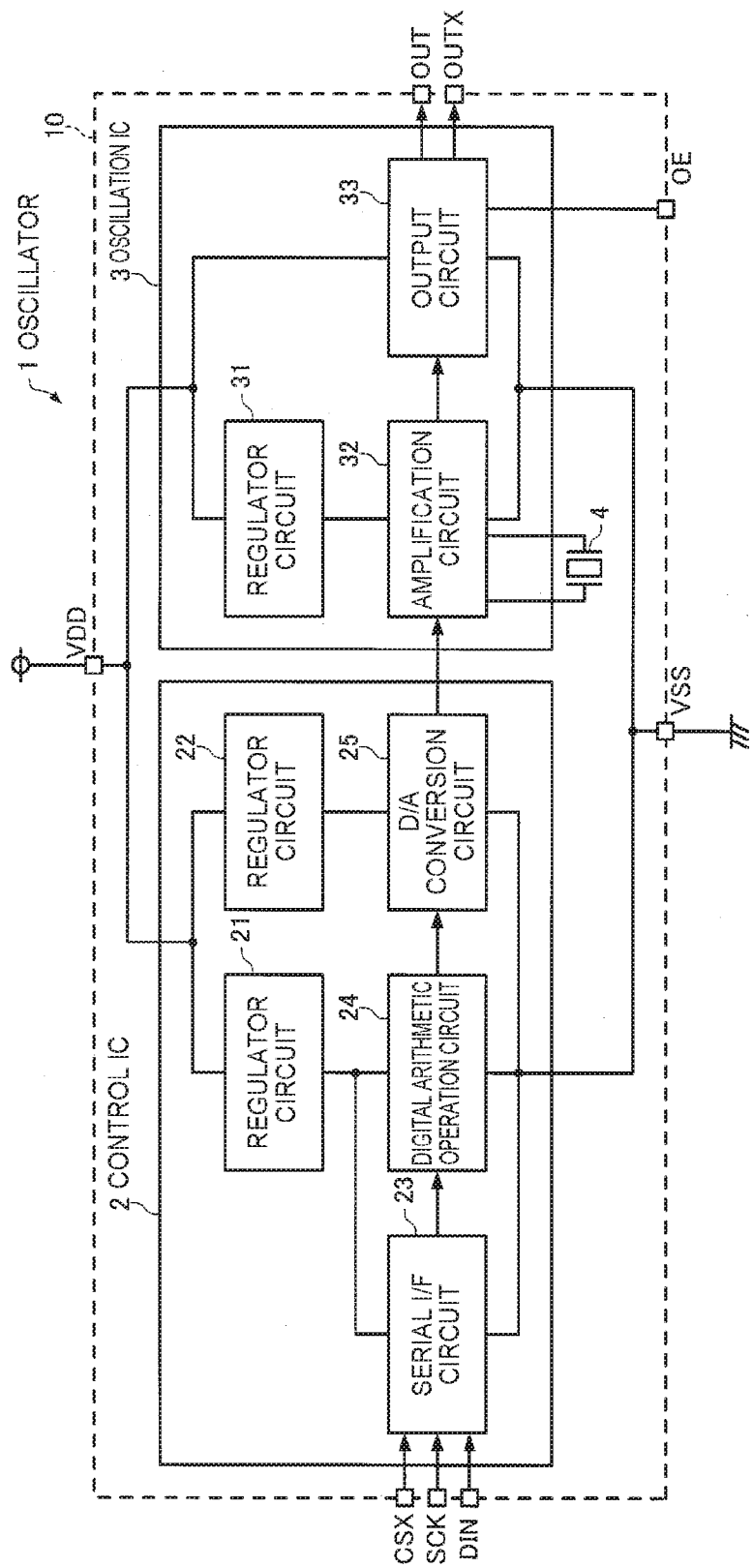
FIG. 2 is a diagram illustrating a configuration of the oscillator according to a first embodiment.

FIG. 1 is a perspective diagram illustrating an oscillator according to a first embodiment. Furthermore, FIG. 2 is a diagram illustrating a configuration of the oscillator according to the first embodiment. An oscillator 1 according to the first embodiment is a digital control oscillator in which control of an oscillation frequency is possible with a digital signal that is input from an external terminal. As illustrated in FIGS. 1 and 2, the oscillator 1 is configured to include a control integrated circuit (IC) 2, an oscillation integrated circuit (IC) 3, a quartz vibrator 4, and a package (container) 10 into which the control IC2, and the oscillation IC3, and the quartz vibrator 4 are to be mounted.

For operation of the control IC2, a power source potential VDD is supplied from a power source terminal VDD of the oscillator 1 to a power terminal of the control IC2, and a ground potential VSS is supplied from a ground terminal GND to a ground terminal of the control IC2. In the same manner, for operation of the oscillation IC3, the power source potential VDD is supplied from the power source terminal VDD of the oscillator 1 to a power source terminal of the oscillation control IC3, and the ground potential VSS is supplied from the ground terminal GND to a ground terminal of the oscillation IC3.

The control IC2, as illustrated in FIG. 2, is configured to include a regulator circuit 21, a regulator circuit 22, a serial interface circuit 23, a digital arithmetic operation circuit 24 and a D/A conversion circuit (digital to analog converter (DAC)) 25.

The regulator circuit 21 is a voltage regulator that generates a constant voltage from the power source potential VDD, and supplies the generated constant voltage to the serial interface circuit 23 and the digital arithmetic operation circuit 24.

The regulator circuit 22 is a voltage regulator that generates a constant voltage from the power source potential VDD and supplies the generated constant voltage to a power source node of the D/A conversion circuit 25, or is an electric current regulator that generates a constant electric current from the power source potential VDD and supplies the generated constant electric current to a power source node of the D/A conversion circuit 25.

The serial interface circuit 23 receives a chip selection signal, a serial data signal, and a clock signal that are input from three external terminals CSX, SCK, and DAIN, respectively, of the oscillator 1, through three terminals of the control IC2, synchronizes the received signals to a clock signal when the chip selection signal is active, acquires a serial data signal and outputs the acquired serial data signal to the digital arithmetic operation circuit 24. The serial interface circuit 23, for example, may be an interface circuit that supports a serial peripheral interface (SPI). Moreover, according to the present embodiment, the serial interface circuit 23 is a three-wire interface circuit, but is not limited to this. For example, the serial interface circuit 23 may be a two-wire interface circuit that supports an inter-integrated circuit ($I^2C$) bus.

The digital arithmetic operation circuit 24 converts the serial data signal that is output by the serial interface circuit 23 into an N-bit data signal, and outputs the N-bit data signal.

The D/A conversion circuit 25 converts the N-bit data signal that is output by the digital arithmetic operation circuit 24 into an analog signal, and thus generates a control signal for controlling the oscillation IC3 and outputs the generated control signal from a terminal of the control IC2. Moreover, an output terminal of the D/A conversion circuit 25 and a control terminal (an input terminal for the control signal) of the oscillation IC3 may be connected to each other through a passive element such as a resistance or a capacitor.

The oscillation IC3 is connected to a quartz vibrator 4, causes the quartz vibrator 4 to resonate with a frequency in accordance with a control signal that is output by the control IC2, and outputs an oscillation signal. The oscillation signal is output, as a differential oscillation signal, to the outside of the oscillator 1 through two external terminals OUT and OUTx of the oscillator 1. Furthermore, the oscillation IC3 controls a resonance frequency of the quartz vibrator 4 based on control by the control IC2. Moreover, the quartz vibrator 4 is one example of a resonator, and in place of the quartz vibrator 4, a different resonator may be used. The resonator may be an electro resonance circuit, and may be an electro mechanical resonator or the like. The resonator, for example, may be a vibrator. The vibrator, for example, may be a piezoelectric vibrator, a surface acoustic wave (SAW) resonator, a micro electro mechanical systems (MEMS) vibrator or the like. Furthermore, as a substrate material of the vibrator, a piezoelectric material, such as piezoelectric ceramic such as lead zirconate titanate, or piezoelectric single crystal such as quartz, lithium tantalate, or lithium niobate, or a silicon semiconductor material, can be used. As an excitation unit of the vibrator, those employing a piezoelectric effect may be used, and electrostatic drive employing Coulomb force may be used. Furthermore, the resonator may be an optical resonator that uses light which interacts with a gas cell that includes an alkali metal or the like inside and with an atom of an alkali metal or the like, a cavity resonator or a dielectric resonator that resonates in a microwave range, an LC resonator, or the like.

Moreover, only one pair (a pair of the power source terminal VDD from which the power potential VDD is supplied and the ground terminal GND from which the ground potential VSS is supplied, in FIG. 2) of external power source terminals of the oscillator 1 may be sufficient. With this configuration, the oscillator 1 can be miniaturized, and if only a power source voltage for one system is supplied to the oscillator 1, the oscillation signal can be output. For this reason, the oscillator 1 can be used as a clock source of a system. However, the oscillator 1 according to the present embodiment may include a pair (a pair of power source terminals for the control IC2 and a pair of power source terminals for the oscillation IC3) of external power source terminals for two or more systems.

As illustrated in FIG. 2, the oscillation IC3 is configured to include a regulator circuit 31, an amplification circuit 32, and an output circuit 33.

The regulator circuit 31 is an electric current regulator that generates a constant electric current from the power source potential VDD and supplies the generated constant electric current to a power source node of an amplification circuit 32, or a voltage regulator that generates a constant voltage from the power source potential VDD and supplies the generated constant voltage to the amplification circuit 32.

The amplification circuit 32, for example, amplifies a signal that is output from the quartz vibrator 4, with a bipolar transistor that operates on an electric current which is supplied from the regulator circuit 31, and causes the quartz vibrator 4 to resonate by feeding the amplified signal back to the quartz vibrator 4. Alternatively, the amplification circuit 32 amplifies the signal that is output from the quartz vibrator 4, with a CMOS inverter element that operates on a voltage that is supplied from the regulator circuit 31, and may cause the quartz vibrator 4 to resonate by feeding the amplified signal back to the quartz vibrator 4.

The amplification circuit 32 has a variable capacitance element, not illustrated, (for example, a variable capacitance diode, MOS capacitance, or the like) that functions as load capacitance of the quartz vibrator 4. A voltage (a control voltage) of the control signal that is output from the control IC2 is applied to the variable capacitance element through a terminal (a control terminal) of the oscillation IC3, and a capacitance value of the variable capacitance element is controlled by the control voltage. Then, an oscillation frequency of the quartz vibrator 4 changes according to the capacitance of the variable capacitance element.

Moreover, for example, various oscillation circuits, such as a pierce oscillation circuit, an inverter-type oscillation circuit, a Colpitts oscillation circuit, and a Hartley oscillation circuit, may be configured from the amplification circuit 32 and the quartz vibrator 4.

The output circuit 33, for example, buffers or level-shifts a signal (an input signal of the quartz vibrator 4) that is amplified by the amplification circuit 32, and generates and outputs an oscillation signal. The output circuit 33, for example, generates a differential oscillation signal in accordance with any one of specifications, such as low-voltage positive emitter coupled logic (LVPECL), low-voltage differential signals (LVDS), and high-speed current steering logic (HCSL). Then, the output circuit 33 outputs an oscillation signal from two terminals of the oscillation IC3 when an external terminal OE is at a high (H) level, and stops the output of the oscillation signal when the external terminal OE is at a low (L) level. The differential oscillation signal that is output from the oscillation IC3 is output from the two external terminals OUT and OUTX of the oscillator 1 to the outside. Moreover, the output circuit 33 may generate a single-end oscillation signal such as a CMOS-level oscillation signal, and may output the generated single-end oscillation signal from the external terminal OUT. In this case, the external terminal OUTX is unnecessary.

The amplification circuit 32 functions as, or the amplification circuit 32 and the output circuit 33 function as an oscillation circuit for causing the quartz vibrator 4 to resonate.

Figure 3:
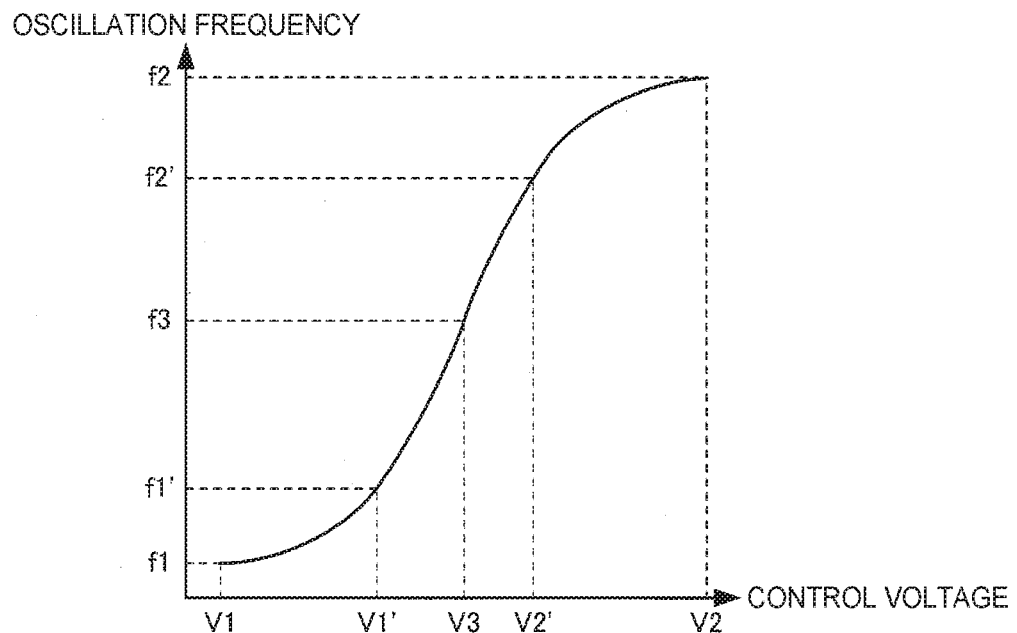
FIG. 3 is a diagram illustrating one example of a relationship between a control voltage and an oscillation frequency according to the first embodiment.

The oscillation circuit that is configured from the oscillation IC3 and the quartz vibrator 4 functions as a voltage controlled crystal oscillation circuit that outputs an oscillation signal with a frequency in accordance with the voltage (the control voltage) (a voltage between terminals of the variable capacitance element) of the control signal that is output by the control IC2. FIG. 3 illustrates one example of a relationship (a control voltage-oscillation frequency characteristic) between a control voltage (a voltage between terminals of the variable capacitance diode) and an oscillation frequency (a frequency of the oscillation signal) in a case where the variable capacitance diode is used as the variable capacitance element. In FIG. 3, the horizontal axis indicates the control voltage and the vertical axis indicates the oscillation frequency. As illustrated in FIG. 3, as the control voltage changes from V1 to V2, the oscillation frequency changes nonlinearly from f1 to f2. Specifically, as the control voltage changes from V1 to V3, a slope (a change rate) of the oscillation frequency increases monotonously, and as the control voltage changes from V3 to V2, the slope (the change rate) of the oscillation frequency decreases monotonously. This nonlinearity of the control voltage-oscillation frequency characteristic is, in most cases, due to the fact that a relationship between the voltage of the terminals of the variable capacitance diode and the capacitance value is nonlinear.

Generally, because linearity of the oscillation frequency is stipulated in an oscillation specification (for example, approximately 5 ppm/V), in a case where the control voltage-oscillation frequency characteristic of the oscillation circuit is nonlinear, a full range (for example, a range from V1 to V2 in FIG. 3) of the control voltage cannot be used, and, in the related art, only a part of range (for example, a range from V1' to V2' in FIG. 3) in which the linearity is good can be used. In this manner, a variable range of the oscillation frequency is limited.

Figure 4:
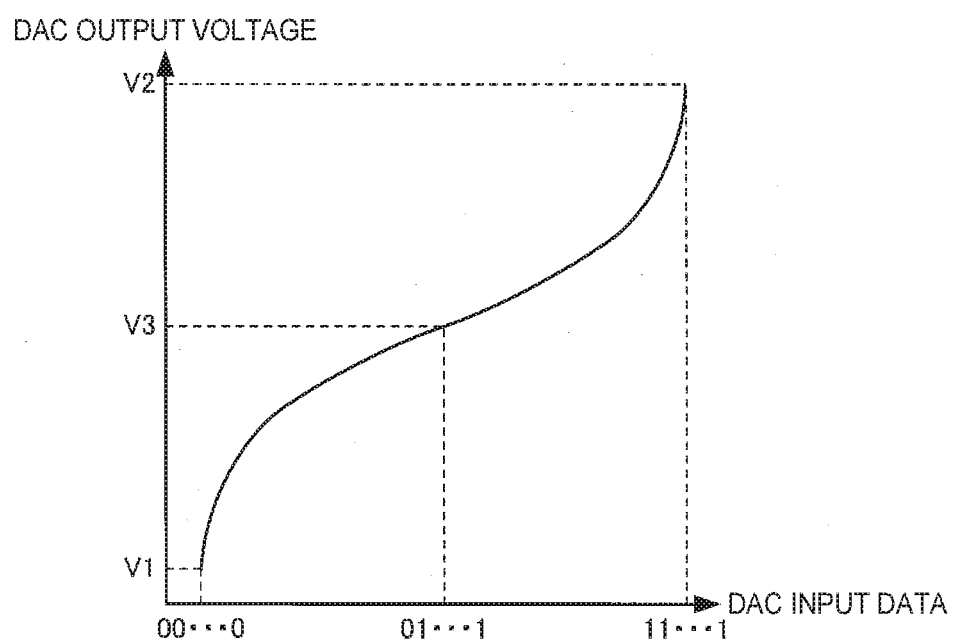
FIG. 4 is a diagram illustrating one example of an input and output characteristic of a D/A conversion circuit according to the first embodiment.

Accordingly, according to the present embodiment, in order to broaden the variable range of the oscillation frequency, an input and output characteristic of the D/A conversion circuit 25 is adjusted in such a manner as to have nonlinearity in the direction of offsetting the nonlinearity of the control voltage-oscillation frequency characteristic of the oscillation circuit. FIG. 4 illustrates one example of the input and output characteristic of the D/A conversion circuit 25. In FIG. 4, the horizontal axis indicates an input code (an N-bit data signal value) of the D/A conversion circuit 25, and the vertical axis indicates an output voltage (a control voltage) of the D/A conversion circuit 25. As illustrated in FIG. 4, as the input code changes from 00 . . . 0 to 11 . . . 1, the output voltage changes nonlinearly from V1 to V2. Specifically, as the input code changes from 00 . . . 0 to 01 . . . 1, the slope (the change rate) of the output voltage decreases monotonously, and as the input code changes from 01 . . . 1 to 11 . . . 1, the slope (the change rate) of the output voltage increases monotonously.

Figure 5:
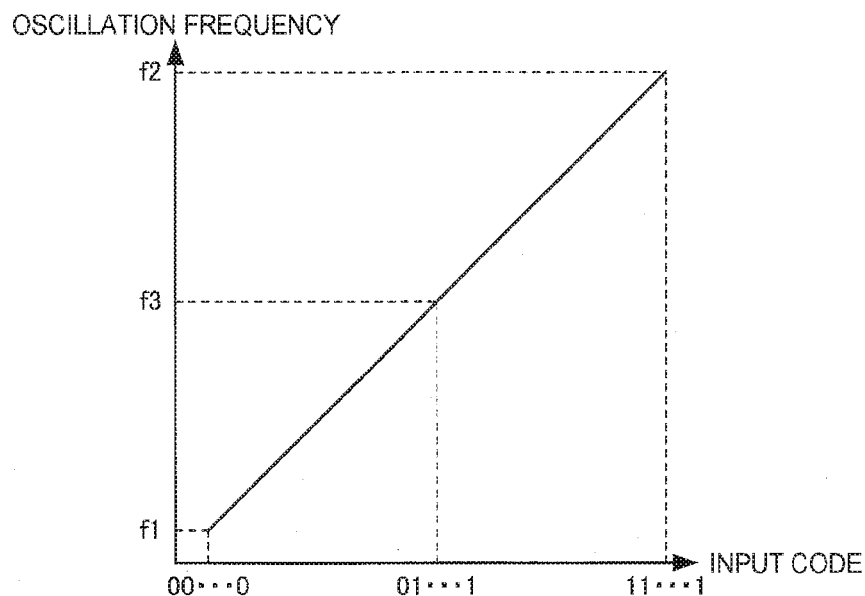
FIG. 5 is a diagram illustrating one example of an input and output characteristic of the oscillator according to the first embodiment.

Therefore, nonlinearity of the input and output characteristic of the D/A conversion circuit 25 and nonlinearity of the control voltage-oscillation frequency characteristic of the oscillation circuit are mutually offset, an input and output characteristic of the oscillator 1 comes close to be linear. FIG. 5 illustrates the input and output characteristic of the oscillator 1 in a case where the oscillation circuit has the control voltage-oscillation frequency characteristic that is illustrated in FIG. 3 and the D/A conversion circuit 25 has an input and output characteristic that is illustrated in FIG. 4. In FIG. 5, the horizontal axis indicates the input code (the N-bit data signal value), and the vertical axis indicates the oscillation frequency. As illustrated in FIG. 5, as the input code changes from 00 . . . 0 to 11 . . . 1, the oscillation frequency changes linearly from V1 to V2. In this manner, because the full range of the control voltage (for example, the range from V1 to V2 in FIG. 3) can be used corresponding to a full range of the input code, the oscillator 1 can further broaden the variable range of the oscillation frequency than in the related art.

Figure 6:
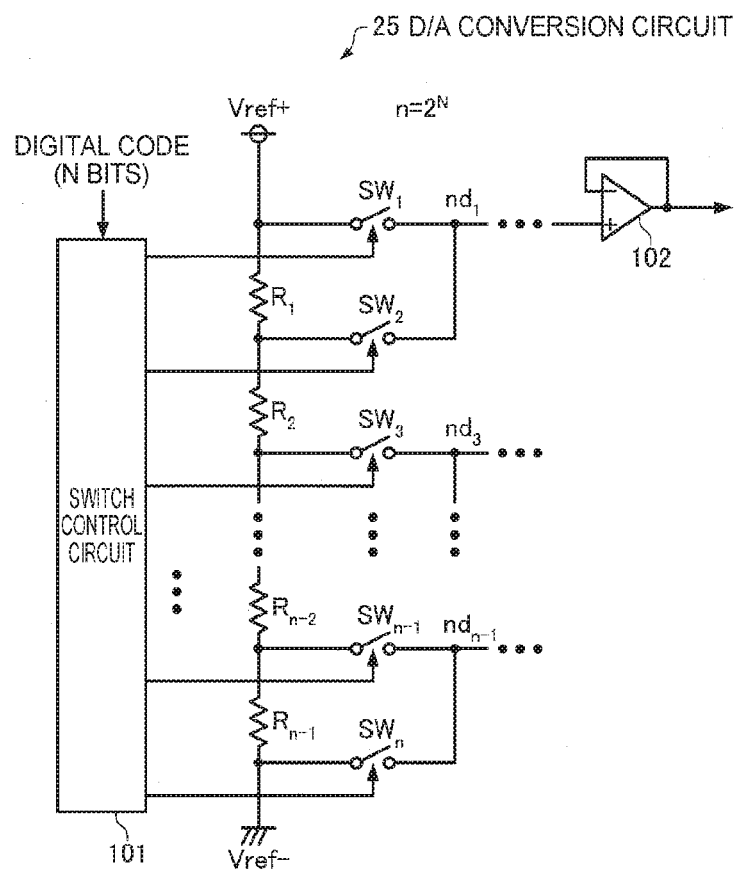
FIG. 6 is a diagram illustrating a configuration example of the D/A conversion circuit.

FIG. 6 is a diagram illustrating a configuration example of the D/A conversion circuit 25 that has the nonlinearity in terms of the input and output characteristic. The D/A conversion circuit 25 in FIG. 6 is configured to include n ($=2^N$)−1 resistors $R_1$ to $R_{n-1}$, n switches $SW_1$ to $SW_n$, a switch control circuit 101 and an arithmetic operation amplifier 102.

The n−1 resistors $R_1$ to $R_{n-1}$ are connected in series between a supply line (a power source node) of a reference voltage Vref+ at the high potential side and a supply line (for example, a ground line) of a reference voltage Vref− at the low potential side. For example, the reference voltage Vref is a constant voltage that is supplied by the regulator circuit 22, and the reference voltage Vref− is a ground voltage (0 V).

Both ends of each resistor $R_k$ (k=1 to n−1) are connected to one end of the switch $SW_k$ and one end of the switch $SW_{k+1}$, respectively, the other end of the switch $SW_k$ and the other end of the switch $SW_{k+1}$ are connected to each other.

Each of connection nodes $nd_I$ between the other end of each of the switches $SW_I$ (I=1, 3, . . . , n−1) and the other end of each of the switches $SW_{I+1}$ is connected to a non-inversion input terminal (a + terminal) of the arithmetic operation amplifier 102 through at least one switch (not illustrated).

The arithmetic operation amplifier 102 functions as a voltage follower of which an output terminal and a non-inversion input terminal (a − terminal) are connected to each other and which supplies a voltage of the non-inversion input terminal (a + terminal) to the output terminal.

An N-bit digital code is input into the switch control circuit 101, and, according to the N-bit digital code, the switch control circuit 101 performs control in such a manner that the switches $SW_I$ (I=1, 3, . . . , n−1) are in an ON state at the same time and the switches $SW_{I+1}$ are in an OFF state at the same time and in such a manner that the switches $SW_I$ are in the OFF state at the same time and the switches $SW_{I+1}$ are in the ON state at the same time. Thus, each of the nodes $nd_I$ (I=1, 3, . . . , n−1) is electrically connected to any one of a terminal at the high potential side, of the resistor $R_1$ and a terminal at the low potential side. Furthermore, the switch control circuit 101 controls a group of switches that are illustrated, in such a manner that only any one of the nodes $nd_1$ is electrically connected to the non-inversion input terminal (the +terminal) of the arithmetic operation amplifier 102. That is, the switch control circuit 101 selects any one voltage of n ($=2^N$) types of voltages that result from voltage division with the resistors $R_1$ to $R_{n-1}$ between the reference voltage Vref+ and the reference voltage Vref−, and outputs the selected voltage to the non-inversion input terminal (the +terminal) of the arithmetic operation amplifier 102.

A switch $SW_m$ (m=1 to n) may be a MOS transistor. In this case, one of a source electrode and a drain electrode of the MOS transistor is connected to any one of the resistors $R_k$ (k=1 to n−1), and the other is connected to any one of the nodes $nd_I$ (I=1, 3, . . . , n−1). Furthermore, a control signal from the switch control circuit 101 is supplied to a gate electrode of each MOS transistor.

A D/A conversion circuit 100, which is configured in this manner, according to the present embodiment, is a D/A conversion circuit that is a type of resistor-caused voltage division (also referred to as a voltage distribution type, a resistor string type, or a voltage potentiometer), and outputs $2^N$ types of voltages in accordance with the N-bit digital code value that is input.

Moreover, control may be performed in such a manner that each of the nodes $nd_1$ (I=1, 3, . . . , n−1) is connected directly to the non-inversion input terminal (the +terminal) of the arithmetic operation amplifier 102 and that according to the N-bit digital code value, the switch control circuit 101 causes any one switch of the switch $SW_m$ (m=1 to n) to be in the ON state and causes the other switches to be in the OFF state.

In the D/A conversion circuit 100, resistance values of at least two of the n−1 resistors $R_1$ to $R_{n-1}$ are made to be different from each other, and thus the output voltage is nonlinear with respect to the digital code that is input. Each value of the n−1 resistors $R_1$ to $R_{n-1}$ is selected and thus the D/A conversion circuit 25 can be realized that has various nonlinear input and output characteristics. For example, the D/A conversion circuit 25 that has an input and output characteristic as illustrated in FIG. 4 satisfies a relationship between resistance values, that is, a resistance value of a resistor $R_1$>a resistance value of a resistor $R_2$> . . . a resistance value of a resistor $R_{n/2-1}$>a resistance value of a resistor $R_{n/2}$<a resistance value of a resistor $R_{n/2+1}$< . . . <a resistance value of a resistor $R_{n-2}$<a resistance value of a resistor $R_{n-1}$. That is, if each of the resistance values of the n−1 resistors $R_1$ to $R_{n-1}$ is suitably selected in such a manner that the resistance value decreases monotonously from the resistor $R_1$ to the resistor $R_{n/2}$ and that the resistance value increases monotonously from the resistor $R_{n/2}$ to the resistor $R_{n-1}$, the D/A conversion circuit 25 can be realized that has the input and output characteristic which is illustrated in FIG. 4.

As described above, the control IC2 functions as a voltage generation unit of generating a voltage that is applied to a variable capacitance element based on the N-bit data signal (one example of the control signal) that is a digital signal. Then, the D/A conversion circuit 25 outputs a voltage that changes nonlinearly with respect to the change in the N-bit data signal, and thus in the oscillator 1 according to the first embodiment, the voltage (the output voltage of the D/A conversion circuit 25) that is applied to the variable capacitance element changes nonlinearly with respect to the change in the N-bit data signal. Thus, because the change in the oscillation frequency with respect to the change in the N-bit data signal is adjusted to come close to be linear, a region where the capacitance of the variable capacitance element changes nonlinearly can be used, and the variable range of the oscillation frequency can be further broadened than in the related art. Furthermore, in a case where the variable range of the oscillation frequency is set to be the same as in the related art, because the control voltage can be greatly increased relative to noise, a carrier to noise ratio (C/N ratio) can be further improved than in the related art.

1-2. Second Embodiment

An oscillator according to a second embodiment is different in a configuration of the control IC2 from the oscillator according to the first embodiment. In the oscillator according to the second embodiment, the same numeral references are given to the same constituent elements according to the first embodiment. Redundant descriptions thereof are hereinafter omitted and descriptions are provided with a focus on a difference with the first embodiment.

Figure 7:
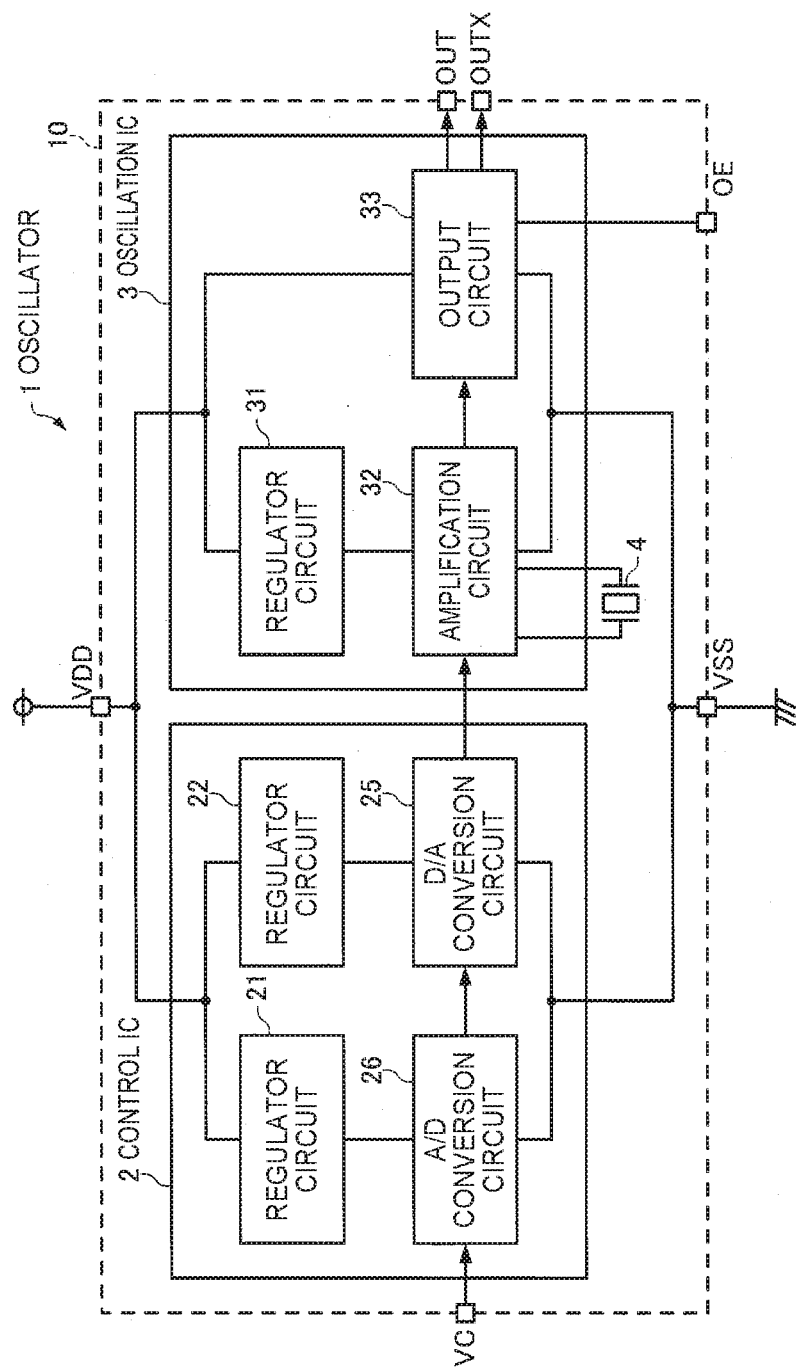
FIG. 7 is a diagram illustrating a configuration of an oscillator according to a second embodiment.

FIG. 7 is a diagram illustrating a configuration of the oscillator according to the second embodiment. As illustrated in FIG. 7, in the oscillator 1 according to the second embodiment, the control IC2 is configured to include the regulator circuit 21, the regulator circuit 22, the D/A conversion circuit 25, and an A/D conversion circuit (analog to digital converter (ADC)) 26.

The regulator circuit 21 generates a constant voltage from the power source potential VDD, and supplies the generated constant voltage to the A/D conversion circuit 26.

The regulator circuit 22 generates a constant voltage from the power source potential VDD, and supplies the generated constant voltage to the power source node of the D/A conversion circuit 25.

The A/D conversion circuit 26 converts a voltage of a frequency control signal (an external control voltage) that is input from the external terminal VC of the oscillator 1 into an N-bit digital signal and outputs the resulting N-bit digital signal. As the A/D conversion circuit 26, as known well, various types of A/D conversion circuits can be used such as a parallel comparison type, a sequential comparison type, a delta sigma type, and a double integration type.

The D/A conversion circuit 25 converts the N-bit digital signal that is output by the A/D conversion circuit 26 into an analog signal, and thus generates a control signal for controlling the control IC3 and outputs the generated control signal from the terminal of the control IC2. Moreover, an output terminal of the D/A conversion circuit 25 and a control terminal (an input terminal for the control signal) of the oscillation IC3 may be connected to each other through a passive element such as a resistance or a capacitor.

Figure 8:
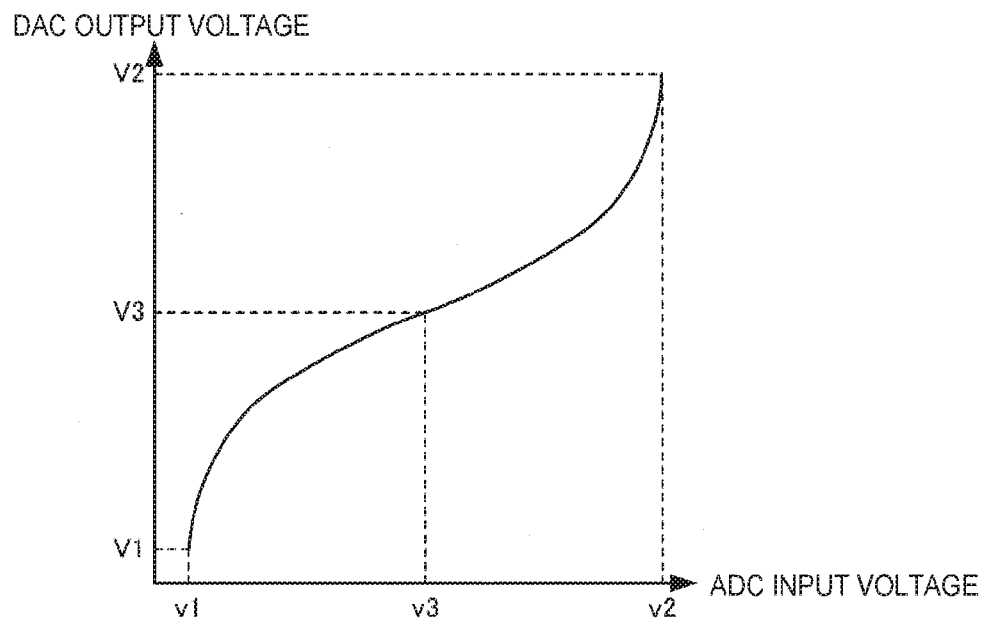
FIG. 8 is a diagram illustrating one example of an input and output characteristic of a circuit that is made from an A/D conversion circuit and a D/A conversion circuit according to the second embodiment.

An oscillation circuit that is configured from the oscillation IC3 and the quartz vibrator 4 is the same in configuration as those according to the first embodiment (FIG. 2), and a control voltage-oscillation frequency characteristic, like that according to the first embodiment, has nonlinearity as illustrated in FIG. 3. According to the present embodiment, in order to broaden the variable range of the oscillation frequency, an input and output characteristic of a circuit that is made from the A/D conversion circuit 26 and the D/A conversion circuit 25 is adjusted in such a manner as to have nonlinearity in the direction of offsetting the nonlinearity of the control voltage-oscillation frequency characteristic of the oscillation circuit. FIG. 8 illustrates one example of the input and output characteristic of the circuit that is made from the A/D conversion circuit 26 and the D/A conversion circuit 25. In FIG. 8, the horizontal axis indicates an input voltage (a voltage of the frequency control signal) of the A/D conversion circuit 26, and the vertical axis indicates an output voltage (a control signal) of the D/A conversion circuit 25. As illustrated in FIG. 8, as the input voltage of the A/D conversion circuit 26 changes from v1 to v2, the output voltage of the D/A conversion circuit 25 changes nonlinearly from V1 to V2. Specifically, as the input voltage of the A/D conversion circuit 26 changes from v1 to v3, a slope (a change rate) of the output voltage of the D/A conversion circuit 25 decreases monotonously, and as the input voltage of the A/D conversion circuit 26 changes from v3 to v2, the slope (the change rate) of the output voltage of the D/A conversion circuit 25 increases monotonously.

Figure 9:
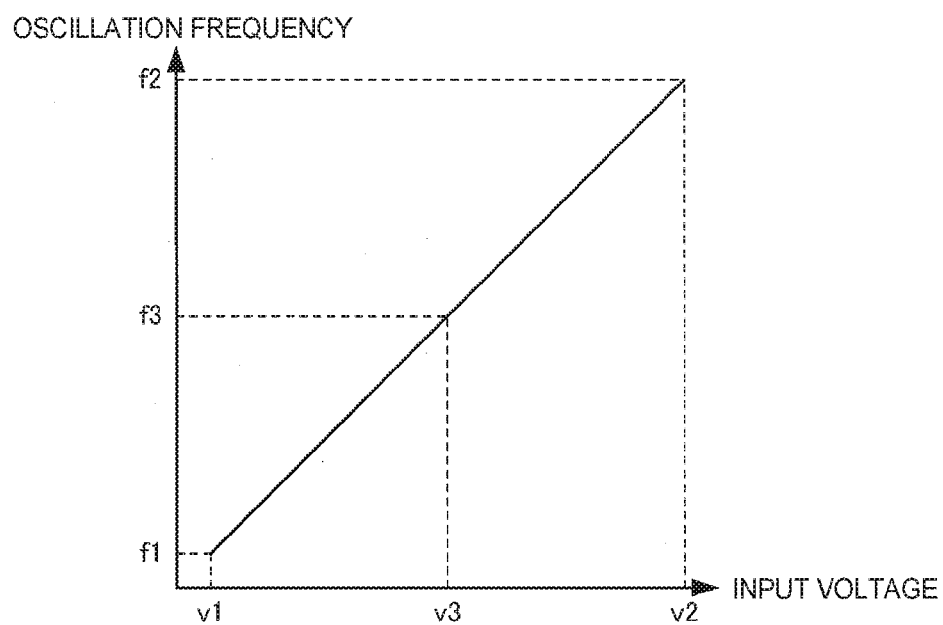
FIG. 9 is a diagram illustrating one example of an input and output characteristic of the oscillator according to the second embodiment.

Therefore, nonlinearity of the input and output characteristic of the circuit that is made from the A/D conversion circuit 26 and the D/A conversion circuit 25, and nonlinearity of the control voltage-oscillation frequency characteristic of the oscillation circuit are mutually offset, an input and output characteristic of the oscillator 1 comes close to be linear. FIG. 9 illustrates the input and output characteristic of the oscillator 1 in a case where the oscillation circuit has the control voltage-oscillation frequency characteristic that is illustrated in FIG. 3 and the circuit that is made from the A/D conversion circuit 26 and the D/A conversion circuit 25 has an input and output characteristic that is illustrated in FIG. 8. In FIG. 9, the horizontal axis indicates the input voltage (the voltage of the frequency control signal) and the vertical axis indicates the oscillation frequency. As illustrated in FIG. 9, as the input voltage changes from v1 to v2, the oscillation frequency changes almost linearly from V1 to V2. In this manner, because the full range of the control voltage (for example, the range from V1 to V2 in FIG. 3) can be used corresponding to a full range of the input voltage), the oscillator 1 can more broaden the variable range of the oscillation frequency than in the related art.

For example, the input and output characteristic of the A/D conversion circuit 26 may be nonlinear and the input and output characteristic of the D/A conversion circuit 25 may be linear. Furthermore, for example, the input and output characteristic of the A/D conversion circuit 26 may be linear and the input and output characteristic of the D/A conversion circuit 25 may be nonlinear. Furthermore, for example, the input and output characteristic of the A/D conversion circuit 26 may be nonlinear and the input and output characteristic of the D/A conversion circuit 25 may also be nonlinear. In any case, the circuit that is made from the A/D conversion circuit 26 and the D/A conversion circuit 25 and that has the nonlinearity in the terms of the input and output characteristic can also be realized. The D/A conversion circuit 25 that has the nonlinearity in terms of the input and output characteristic, for example, can be realized by a configuration example that is illustrated in FIG. 6.

Figure 10:
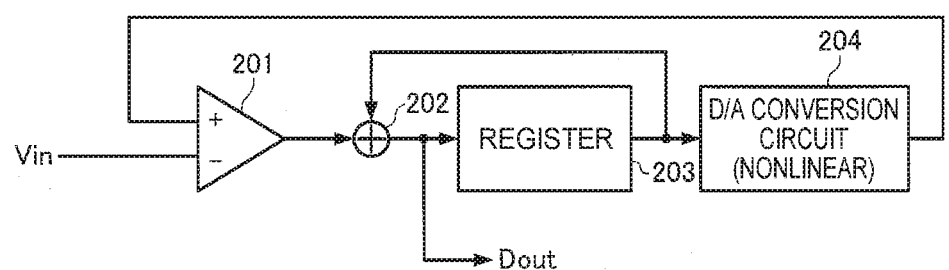
FIG. 10 is a diagram illustrating a configuration example of the A/D conversion circuit.

FIG. 10 is a diagram illustrating a configuration example of the A/D conversion circuit 26 that has the nonlinearity in terms of the input and output characteristic. The A/D conversion circuit 26 in FIG. 10 is configured to include a comparator 201, an adder 202, a register 203, and a D/A conversion circuit 204.

The comparator 201 compares a voltage Vin and an output voltage of the D/A conversion circuit 204. In a case where the Vin is higher than the output voltage of the D/A conversion circuit 204, the comparator 201 outputs a low level voltage to the input signal (the frequency control signal). In a case where the output voltage of the D/A conversion circuit 204 is higher than the Vin, the comparator 201 outputs a high level voltage to the input signal (the frequency control signal).

The adder 202 adds 0 to the N-bit data that is stored in the register 203 when the output voltage of the comparator 201 is at the low level, and outputs an N-bit data that results from the addition. The adder 202 adds 1 to the N-bit data that is stored in the register 203 when the output voltage of the comparator 201 is at the high level, and outputs an N-bit data that results from the addition. This output data of the adder 202 is output data Dout of the A/D conversion circuit 26.

The register 203 initializes the data that is stored, to 0 when starting A/D conversion, and thereafter, synchronizes the data that is stored, to a clock signal that is not illustrated and stores output data of the adder 202.

The D/A conversion circuit 204 converts an N-bit data that is stored in the register 203, into an analog voltage, and outputs a result of the conversion. With a configuration as illustrated in FIG. 6, the D/A conversion circuit 204, for example, has the nonlinearity in terms of the input and output characteristic.

The A/D conversion circuit 26 that is configured in this manner has the nonlinear input and output characteristic in accordance with the input and output characteristic of the D/A conversion circuit 204.

As described above, the control IC2 functions as a voltage generation unit of generating a voltage that is applied to a variable capacitance element based on the frequency control signal (one example of the control signal) that is an analog signal. Then, with regard to a change in the frequency control signal, the A/D conversion circuit 26 converts the frequency control signal into the N-bit data signal that is a digital signal that changes nonlinearly with respect to the change in the frequency control signal. Alternatively, the D/A conversion circuit 25 converts the N-bit data signal converted by the A/D conversion circuit 26 into a voltage that changes nonlinearly with respect to the change in the N-bit data signal. Thus, in the oscillator 1 according to the second embodiment, because the voltage (the output voltage of the D/A conversion circuit 25) that is applied to the variable capacitance element changes nonlinearly and the change in the oscillation frequency with respect to the change in the frequency control signal is adjusted to come close to be linear, a region where the capacitance of the variable capacitance element changes nonlinearly can be used, and the variable range of the oscillation frequency can be more broadened than in the related art. Furthermore, in the case where the variable range of the oscillation frequency is set to be the same as in the related art, because the control voltage can be greatly increased relative to noise, the C/N ratio can be more improved than in the related art.

1-3. Third Embodiment

An oscillator according to a third embodiment is different in the configuration of the control IC2 from the oscillator according to the first embodiment and the oscillator according to the second embodiment. In the oscillator according to the third embodiment, the same numeral references are given to the same constituent elements according to the first embodiment and according to the second embodiment. Redundant descriptions thereof are hereinafter omitted and descriptions are provided a focus on a difference with the first embodiment and the second embodiment.

Figure 11:
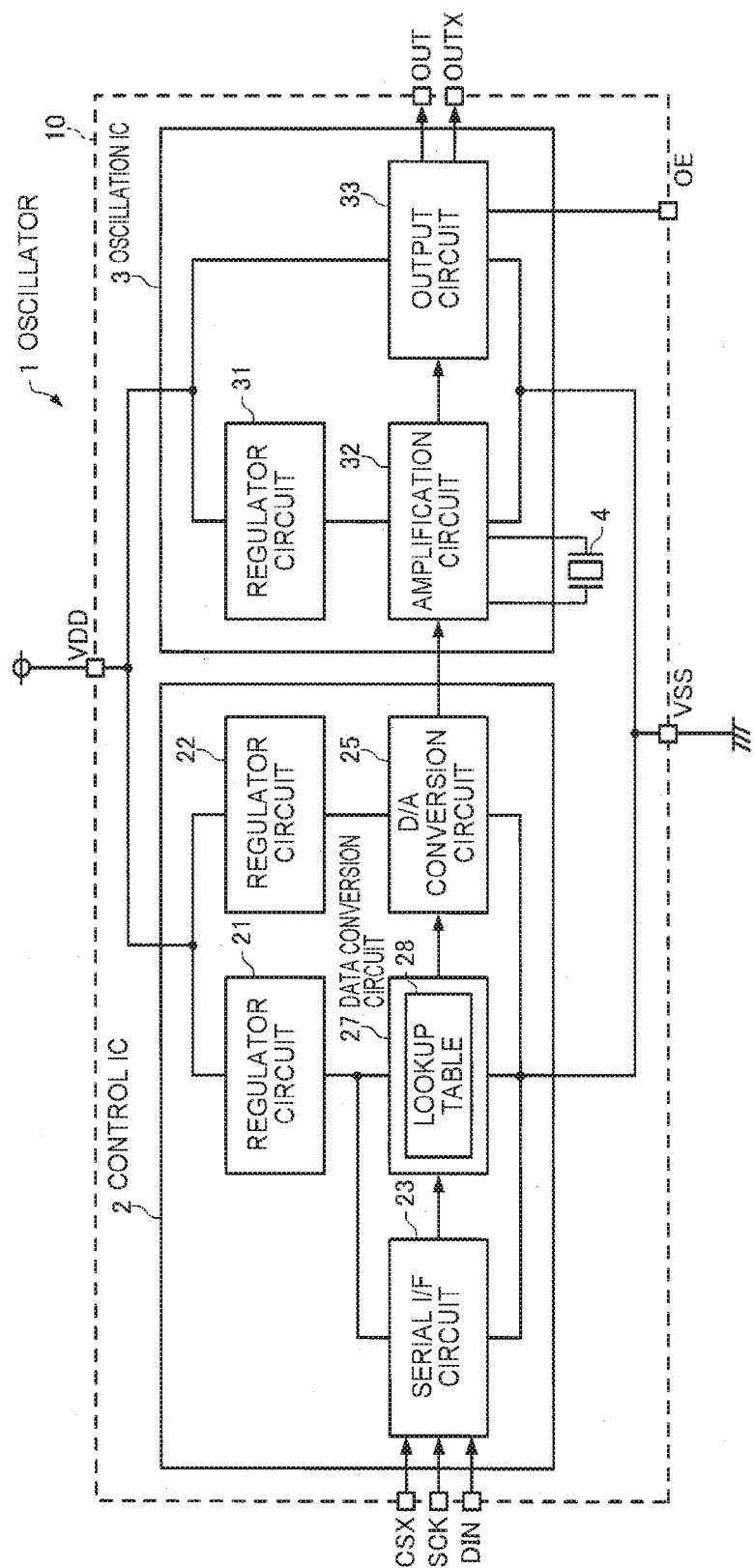
FIG. 11 is a diagram illustrating a configuration of an oscillator according to a third embodiment.

FIG. 11 is a diagram illustrating a configuration of the oscillator according to the third embodiment. As illustrated in FIG. 11, in the oscillator 1 according to the third embodiment, the control IC2 is configured to include the regulator circuit 21, the regulator circuit 22, the serial interface circuit 23, the D/A conversion circuit 25, and a data conversion circuit 27.

The regulator circuit 21 generates a constant voltage from the power source potential VDD, and supplies the generated constant voltage to the serial interface circuit 23 and the data conversion circuit 27.

The regulator circuit 22 generates a constant voltage from the power source potential VDD, and supplies the generated constant voltage to the power source node of the D/A conversion circuit 25.

The serial interface circuit 23 receives a chip selection signal, a serial data signal, and a clock signal that are input from three external terminals CSX, SCK, and DAIN, respectively, of the oscillator 1, through three terminals of the control IC2, synchronizes the received signals to a clock signal when the chip selection signal is active, acquires a M-bit serial data signal and outputs the acquired serial data signal to the digital arithmetic operation circuit 24.

The data conversion circuit 27 (one example of a signal conversion unit) converts the M-bit serial signal that is output by the serial interface circuit 23 into N-bit data that changes nonlinearly with respect to the change in the M-bit serial data signal, using a lookup table 28, and outputs the resulting N-bit data to the D/A conversion circuit 25.

The D/A conversion circuit 25 converts the N-bit digital signal that is output by the data conversion circuit 27 into an analog signal, and thus generates a control signal for controlling the oscillation IC3 and outputs the generated control signal from the terminal of the control IC2. Moreover, an output terminal of the D/A conversion circuit 25 and a control terminal (an input terminal for the control signal) of the oscillation IC3 may be connected to each other through a passive element such as a resistance or a capacitor.

An oscillation circuit that is configured from the oscillation IC3 and the quartz vibrator 4 is the same in configuration as those according to the first embodiment (FIG. 2), and a control voltage-oscillation circuit characteristic, like that according to the first embodiment, has nonlinearity as illustrated in FIG. 3. According to the present embodiment, in order to broaden the variable range of the oscillation frequency, an input and output characteristic of the data conversion circuit is adjusted in such a manner as to have nonlinearity in the direction of offsetting the nonlinearity of the control voltage-oscillation frequency characteristic of the oscillation circuit, and the output voltage for the input signal (the N-bit data signal), of the D/A conversion circuit 25 changes linearly.

Figure 12:
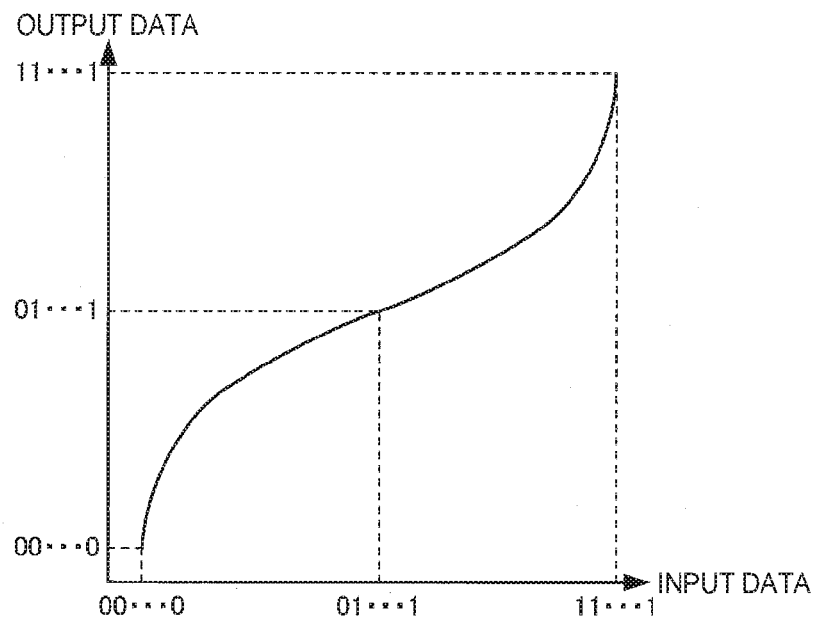
FIG. 12 is a diagram illustrating one example of an input and output characteristic of a data conversion circuit according to the third embodiment.

FIG. 12 illustrates one example of the input and output characteristic of the data conversion circuit 27. In FIG. 12, the horizontal axis indicates an input code (a value of the M-bit serial data signal) of the data conversion circuit 27, and the vertical axis indicates an output code (a value of the N-bit data signal) of the data conversion circuit 27. As illustrated in FIG. 12, the output code of the data conversion circuit 27 changes from 00 . . . 0 to 11 . . . 1 nonlinearly with respect to the change of the input code from 00 . . . 0 to 11 . . . 1. Specifically, as the input code changes from 00 . . . 0 to 01 . . . 1, a slope (a change rate) of the output code decreases monotonously, and as the input code changes from 01 . . . 1 to 11 . . . 1, the slope (the change rate) of the output code increases monotonously. For example, a correspondence relationship between a value of an input data and a value of an output data, as illustrated in FIG. 12, is stored in the lookup table 28, and the output code that is stored in the lookup table 28 is output for the input code. Thus, the data conversion circuit 27 can be realized that has the nonlinear input and output characteristic.

Figure 13:
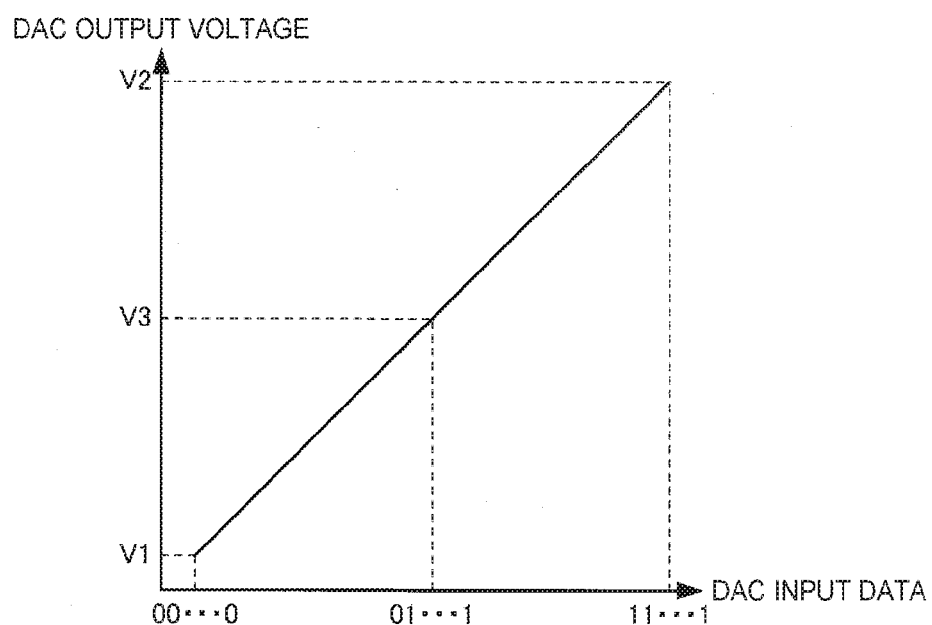
FIG. 13 is a diagram illustrating one example of an input and output characteristic of a D/A conversion circuit according to the third embodiment.

FIG. 13 illustrates one example of the input and output characteristic of the D/A conversion circuit 25. In FIG. 13, the horizontal axis indicates an input code (an N-bit data signal value) of the D/A conversion circuit 25, and the vertical axis indicates an output voltage (a control voltage) of the D/A conversion circuit 25. As illustrated in FIG. 13, as the input code of the D/A conversion circuit 25 changes from 00 . . . 0 to 11 . . . 1, the output voltage of the D/A conversion circuit 25 changes from V1 to V2 almost linearly. The D/A conversion circuit 25 that has the linearity in terms of the input and output characteristic, for example, as illustrated in FIG. 6, can be realized by setting n−1 resistors $R_1$ to $R_{n-1}$ to the same resistance value in the configuration example that is illustrated in FIG. 6.

According to the present embodiment, nonlinearity of the input and output characteristic of the data conversion circuit 27 and nonlinearity of the control voltage oscillation frequency characteristic of the oscillation circuit are mutually offset, the input and output characteristic of the oscillator 1 comes close to linearity. The input and output characteristic of the oscillation circuit 1 is as illustrated in FIG. 5, in a case where the oscillation circuit has the control voltage-oscillation frequency characteristic that is illustrated in FIG. 3, the data conversion circuit 27 has the input and output characteristic that is illustrated in FIG. 12, and the D/A conversion circuit 25 has the input and output characteristic that is illustrated in FIG. 13. That is, an M-bit input code changes from 00 . . . 0 to 11 . . . 1, the oscillation frequency changes from V1 to V2 almost linearly. In this manner, because the full range of the control voltage (for example, the range from V1 to V2 in FIG. 3) can be used corresponding to a full range of the input code, the oscillator 1 can more broaden the variable range of the oscillation frequency than in the related art. Moreover, if it is defined as N=M, an increase in a size of the D/A conversion circuit 25 can be suppressed, but resolution of the oscillation frequency is degraded. On the other hand, if it is defined as N>M, the size of the D/A conversion circuit 25 increases, but the resolution of the oscillation frequency can be improved.

As described above, the control IC2 functions as a voltage generation unit of generating a voltage that is applied to a variable capacitance element based on the M-bit data signal (one example of the control signal) that is a digital signal. Then, the data conversion circuit 27 converts the M-bit data signal converts into the N-bit data signal that is a digital signal which changes nonlinearly with respect to the change in the M-bit data signal, and outputs the resulting N-bit data signal to the D/A conversion circuit 25, and thus in the oscillator 1 according to the third embodiment, the voltage (the output voltage of the D/A conversion circuit 25) that is applied to the variable capacitance element changes nonlinearly. Thus, because the change in the oscillation frequency with respect to the change in the M-bit data signal is adjusted to come close to be linear, a region where the capacitance of the variable capacitance element changes nonlinearly can also be used, and the variable range of the oscillation frequency can be more broadened than in the related art. Furthermore, in the case where the variable range of the oscillation frequency is set to be the same as in the related art, because the control voltage can be greatly increased relative to noise, the C/N ratio can be more improved than in the related art.

1-4. Modification Examples

Various modifications of the oscillators 1 according to the first to third embodiments are possible.

1-4-1. First Modification Example

For example, the oscillator 1 described above according to each of the embodiments is configured from two chip ICs, that is, the control IC2 and the oscillation IC3, and the quartz vibrator 4, but may be configured from one chip IC that is equipped with functions of the control IC2 and the oscillation IC 3, and the quartz vibrator 4. Alternatively, the oscillator 1 may be configured from three or more ICs and the quartz vibrator 4.

1-4-2. Second Modification Example

Figure 14:
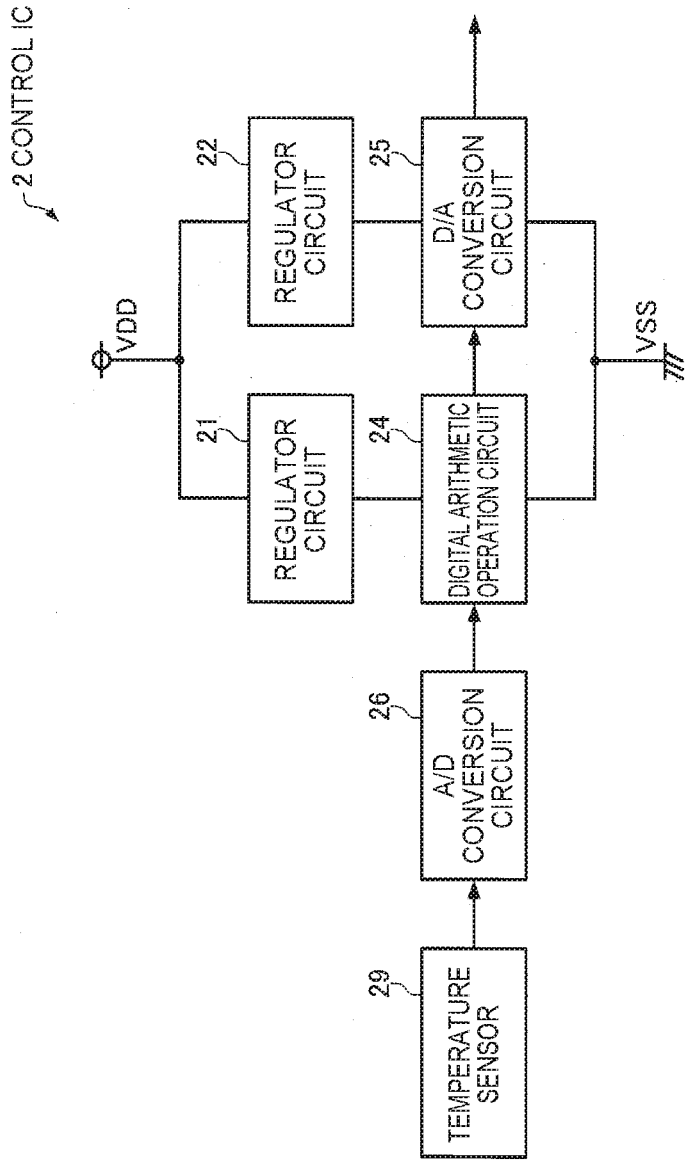
FIG. 14 is a diagram illustrating a configuration example of a control IC in an oscillator in a modification example.

Furthermore, any one of the oscillator 1 according to each of the first embodiment to the third embodiment is an oscillator (a digital control type oscillator or voltage control oscillator) in which an oscillation frequency changes according to an external control signal, but may be modified to an oscillator that has a temperature compensation function. As one example, in the oscillator 1 that has the temperature compensation function that results from making a modification to the oscillator 1 according to the first embodiment, a configuration example of the control IC2 is illustrated in FIG. 14. Moreover, in the oscillator 1 in the present modification example, the oscillation IC3 may be configured as illustrated in FIG. 2. As illustrated in FIG. 14, in the oscillator 1 in the present modification example, the control IC2 is configured to include the regulator circuit 21, the regulator circuit 22, the digital arithmetic operation circuit 24, the D/A conversion circuit 25, the A/D conversion circuit 26, and a temperature sensor 29.

The temperature sensor 29 is a thermosensitive element that outputs a signal (for example, a voltage in accordance with temperature) in accordance with ambient temperature of the temperature sensor 29, and, for example, can be realized by a configuration or the like in which one or multiple diodes are in series in a forward direction between the output of the diode and the ground.

The A/D conversion circuit 26 converts an output signal of the temperature sensor 29 into a digital signal and outputs the resulting digital signal.

The digital arithmetic operation circuit 24 calculates a digital value of a temperature compensation voltage for adjusting a frequency temperature characteristic of the quartz vibrator 4 using an output signal of the A/D conversion circuit 26, and generates and outputs an N-bit data signal.

The D/A conversion circuit 25 converts the N-bit data signal into an analog signal, and thus generates a control signal for controlling the oscillation IC3 and outputs the generated control signal from the terminal of the control IC2.

At least one of the A/D conversion circuit 26 and the D/A conversion circuit 25 is nonlinear in terms of the input and output characteristic. The voltage (the output voltage of the D/A conversion circuit 25) that is applied to the variable capacitance element changes nonlinearly. The change in the oscillation frequency with respect to the change in the frequency control signal is adjusted to come close to be linear.

The oscillator 1 with this configuration in the present modification example is a temperature compensated oscillator that can retain an oscillation frequency in an almost constant manner without depending on temperature by adjusting a frequency of the oscillation IC3 (a voltage control oscillation circuit) with a digital signal that is based on a signal which is output from the temperature sensor 29.

Figure 15:
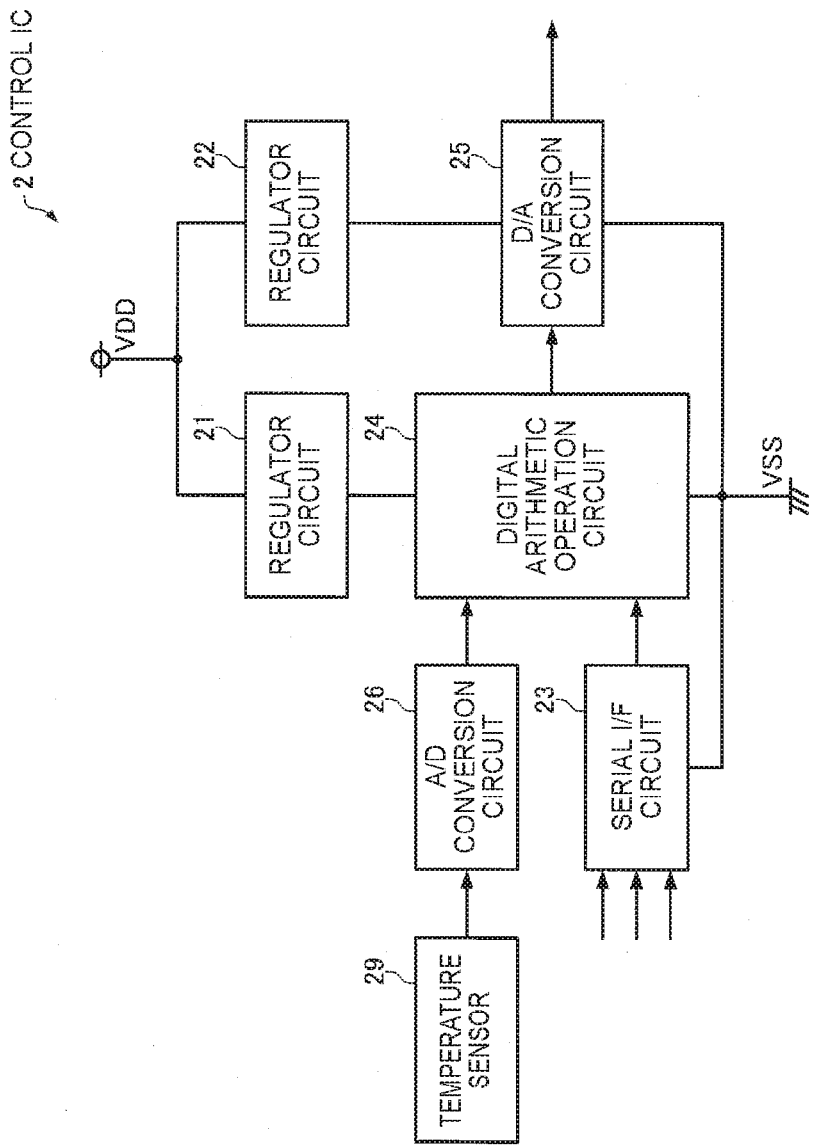
FIG. 15 is a diagram illustrating another configuration example of the control IC in the oscillator in the modification example.

Furthermore, the oscillator 1 in the present modification example may have a configuration that results from replacing the control IC2 in FIG. 14 with the control IC2 in FIG. 15 in terms of configuration. In FIG. 15, the same numeral references are given to the same constituent elements as those in FIG. 14, and redundant descriptions thereof are omitted. In the oscillator 1 in a modification example that is illustrated in FIG. 15, the control IC2 is configured to include the regulator circuit 21, the regulator circuit 22, the serial interface circuit 23, the digital arithmetic operation circuit 24, the D/A conversion circuit 25, the A/D conversion circuit 26 and the temperature sensor 29.

The digital arithmetic operation circuit 24 calculates the digital value of the temperature compensation voltage for adjusting the frequency temperature characteristic of the quartz vibrator 4 using the output signal of the A/D conversion circuit 26, converts a serial data signal that is output by the serial interface circuit 23 into a digital value, generates an N-bit data signal by adding the digital value to a digital value of the temperature compensation voltage, and outputs a result of the addition.

The D/A conversion circuit 25 converts the N-bit data signal into an analog signal, and thus generates a control signal for controlling the oscillation IC3 and outputs the generated control signal from the terminal of the control IC2.

At least one of the A/D conversion circuit 26 and the D/A conversion circuit 25 is nonlinear in terms of the input and output characteristic. The voltage (the output voltage of the D/A conversion circuit 25) that is applied to the variable capacitance element changes nonlinearly. The change in the oscillation frequency with respect to the change in the frequency control signal is adjusted to come close to be linear.

The oscillator 1 with this configuration in the present modification example is a temperature compensated oscillator which retains the oscillation frequency in an almost constant manner without depending on temperature by adjusting the frequency of the oscillation circuit IC3 (the voltage control oscillation circuit) with a digital signal that is based on a signal which is output from the temperature sensor 29 and with a digital signal that is input from an external terminal, and in which control of the oscillation frequency is possible with a control signal that is input from an external terminal.

2. Electronic Apparatus

Figure 16:
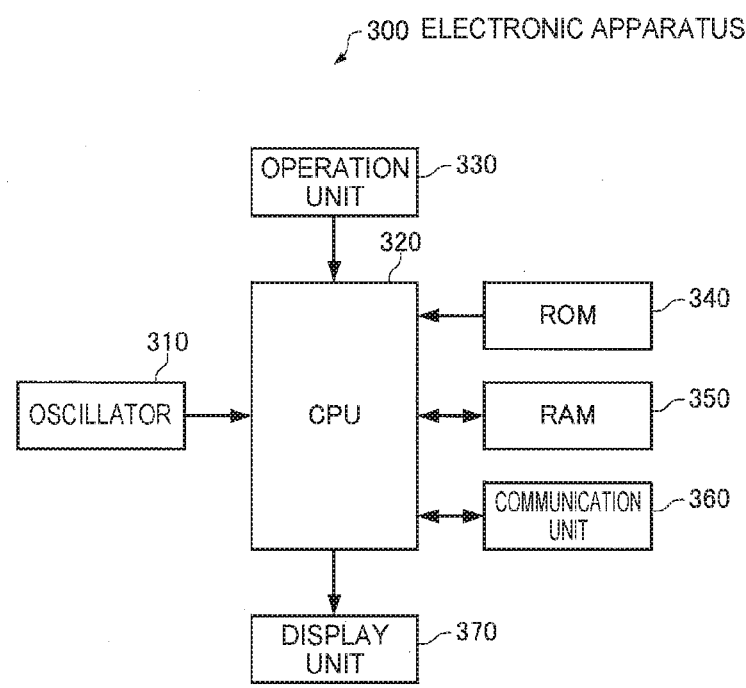
FIG. 16 is a functional block diagram illustrating one example of a configuration of an electronic apparatus according to the present embodiment.

FIG. 15 is a functional block diagram illustrating one example of a configuration of an electronic apparatus according to the present embodiment. An electronic apparatus 300 according to the present embodiment is configured to include an oscillator 310, a central processing unit (CPU) 320, an operation unit 330, a read only memory (ROM) 340, a random access memory (RAM) 350, a communication unit 360, and a display unit 370. Moreover, the electronic apparatus according to the present embodiment may have a configuration that results from omitting or changing one or several of the constituent elements (units) in FIG. 16, or may have a configuration that results from adding a different constituent element to the constituent elements in FIG. 16.

The oscillator 310 has a resonator (not illustrated), an oscillation circuit (not illustrated) that causes the resonator to resonate, and a control circuit (not illustrated) for controlling the oscillation circuit, built in, and the oscillator 310 outputs an oscillation signal due to the resonance by the resonator. The oscillation signal is output from the oscillator 310 to the CPU 320.

The CPU 320 performs various computing processing operations or control processing operations, with an oscillation signal input from the oscillator 310 as a clock signal, according to a program that is stored in the ROM 340 or the like. Specifically, the CPU 320 performs various processing operations in accordance with an operation signal from an operation unit 330, processing that controls the communication unit 360 for performing data communication with an external device, processing that transmits a display signal for displaying various pieces of information on the display unit 370, and the like.

The operation unit 330 is an input device that is configured from operation keys, button switches, and the like, and outputs the operation signal in accordance with a user operation to the CPU 320.

A program, data, and the like that are necessary for the CPU 320 to perform various computing processing operations or control processing operations are stored in the ROM 340.

The RAM 350 is used as a working area for the CPU 320, and the program or the data that is read from the ROM 340, data that is input from the operation unit 330, a result of arithmetic operation that is performed by the CPU 320 according to various programs, or the like is stored temporarily in the RAM 350.

The communication unit 360 performs various control operations for establishing data communication between the CPU 320 and an external device.

The display unit 370 is a display device that is configured as a liquid crystal display (LCD) or the like, and various pieces of information are displayed on the display unit 370, based on the display signal that is input from the CPU 320. A touch panel that functions as the operation unit 330 may be provided on the display unit 370.

For example, the oscillator 1 described above according to each of the embodiments or the oscillator 1 described above in each of the modification examples are applied as the oscillator 310. Thus, the electronic apparatus that has high reliability can be realized.

Various electronic apparatuses are considered as the electronic apparatus 300. As examples of these, there are a personal computer (for example, a mobile type personal computer, a laptop type personal computer, or a tablet type personal computer), a mobile terminal such as a smartphone or a portable telephone, a digital camera, an ink jet type discharge device (for example, an ink jet printer), a digital phase locked loop (PLL), a communication network device (for example, a storage area network device such as a router or a switch, or a local area network device), a device for a mobile terminal station, a television set, a video camera, a video recorder, a car navigation device, a real time clock device, a pager, an electronic organizer (including an electronic organizer equipped with a communication function), an electronic dictionary, a calculator, an electronic game device, a game controller, a word processor, a workstation, a television telephone, a crime prevention television monitor, an electronic binocular, a POS terminal, medical apparatuses (for example, an electronic thermometer, a manometer, a blood sugar meter, an electrocardiogram measurement apparatus, a ultrasonic diagnostic apparatus, and electronic endoscopy), a fish detector, various measurement apparatuses, meters (for example, meters for a vehicle, an airplane, and a ship), a flight simulator, a head-mounted display, motion trace, motion tracking, a motion controller, a pedestrian dead reckoning (PDR), and the like.

One example of the electronic apparatus 300 according to the present embodiment is a transmission device that functions as a terminal base station device that performs communication with a terminal in a wired or wireless manner, using the oscillator 310 as a reference signal source, a voltage-controlled oscillator (VCO), or the like. The electronic apparatus 300 according to the present embodiment can also be applied to a transmission apparatus that desirably has high performance and high reliability and that is available, for example, for use in a communication base station, for example, by applying the oscillator 1 described above according to each of the embodiments or the oscillator 1 described above in each of the modification examples, as the oscillator 310.

3. Moving Object

Figure 17:
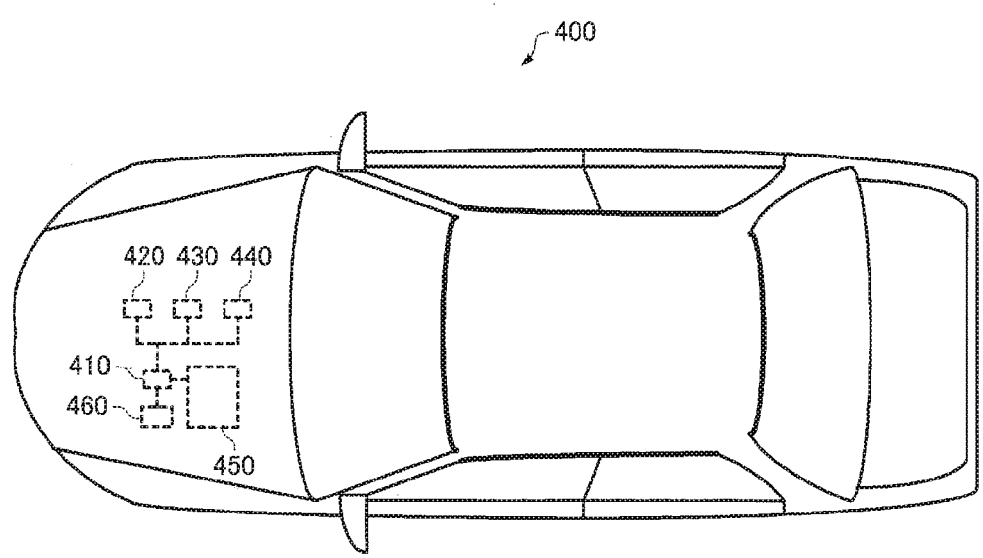
FIG. 17 is a diagram illustrating one example of a moving object according to the present embodiment.

FIG. 17 is a diagram (a top view) illustrating one example of a moving object according to the present embodiment. A moving object 400 that is illustrated in FIG. 17 is configured to include an oscillator 410 and controllers 420, 430, and 440 that perform various control operations such as an engine system, a brake system, and a keyless entry system, a battery 450, and a backup battery 460. Moreover, the moving object according to the present embodiment may have a configuration that results from omitting one or several of the constituent elements (units) in FIG. 17, or may have a configuration that results from adding a different element to the constituent elements in FIG. 17.

The oscillator 410 has a resonator (not illustrated), an oscillation circuit (not illustrated) that causes the resonator to resonate, and a control circuit (not illustrated) for controlling the oscillation circuit, built in, and outputs an oscillation signal due to the resonance by the resonator. The oscillation signal is supplied from the oscillator 410 to the controllers 420, 430, and 440, and for example, is used as a clock signal.

The battery 450 supplies electric power to the oscillator 410 and the controllers 420, 430, and 440. The backup battery 460 supplies electric power to the oscillator 410 and the controllers 420, 430, and 440 when an output voltage of the battery 450 falls below a threshold.

The high-reliability moving object can be realized by applying the oscillator 1 described above according to each of the embodiments or the oscillator 1 described above in each of the modification example, as the oscillator 410.

As the moving object 400, various moving objects are considered. As examples of these, there are vehicles (also including an electric car), airplanes such as a jet or a helicopter, ships, rockets, and satellites.

The invention is not limited to the present embodiment, and it is possible to make various modifications within the scope of the gist of the invention.

The embodiments and the modification examples, which are described above, are examples, and the invention is not limited to these. For example, suitable combinations of the embodiments and the modification examples are also possible.

The invention includes substantially the same configuration (for example, a configuration that has the same function, the same way, and the same result or that has the same effect) as described according to each of the embodiments. Furthermore, the invention includes a configuration in which an unsubstantial portion of the configuration that is described according to each of the embodiment is replaced. Furthermore, the invention includes a configuration that achieves the same operational effect as the configuration that is described according to each of the embodiments, or a configuration that can accomplish the same object. Furthermore, the invention includes a configuration that results from adding a known technology to the configuration that is described according to each of the embodiments.

The entire disclosure of Japanese Patent Application No. 2015-020197, filed Feb. 4, 2015 is expressly incorporated by reference herein.

What is claimed is:

1. An oscillator comprising:
    an oscillation circuit that includes a variable capacitance element and whose oscillation frequency changes based on a voltage that is applied to the variable capacitance element; and
    a voltage generation unit that generates the voltage which is applied to the variable capacitance element based on a control signal, wherein the voltage generation unit includes a D/A conversion circuit and the control signal is a digital signal,
    wherein the voltage that is generated by the voltage generation unit changes nonlinearly with respect to a change in the control signal such that a change in the oscillation frequency with respect to the change in the control signal is adjusted to come close to being linear.

2. The oscillator according to claim 1,
wherein an output voltage of the D/A conversion circuit changes nonlinearly with respect to a change in an input signal.

3. An electronic apparatus comprising:
the oscillator according to claim 2.

4. A moving object comprising:
the oscillator according to claim 2.

5. The oscillator according to claim 1,
wherein an output voltage of the D/A conversion circuit changes linearly with respect to a change in an input signal, and
wherein the voltage generation unit includes a signal conversion unit that converts the control signal into a signal that changes nonlinearly with respect to the change in the control signal and outputs the signal to the D/A conversion circuit.

6. The oscillator according to claim 5,
wherein the signal conversion unit converts the control signal into the signal that changes nonlinear, using a lookup table.

7. An electronic apparatus comprising:
the oscillator according to claim 6.

8. A moving object comprising:
the oscillator according to claim 6.

9. An electronic apparatus comprising:
the oscillator according to claim 5.

10. A moving object comprising:
the oscillator according to claim 5.

11. An electronic apparatus comprising:
the oscillator according to claim 1.

12. A moving object comprising:
the oscillator according to claim 1.

13. An oscillator comprising:
an oscillation circuit that includes a variable capacitance element and whose oscillation frequency changes based on a voltage that is applied to the variable capacitance element; and
a voltage generation unit that generates the voltage which is applied to the variable capacitance element based on a control signal, wherein:
the control signal is an analog signal, and
the voltage generation unit includes
an A/D conversion circuit that converts the control signal into a digital signal, and
a D/A conversion circuit that converts the digital signal converted by the A/D conversion circuit into the voltage that is applied to the variable capacitance element,
wherein the A/D conversion circuit converts the control signal into the digital signal that changes nonlinearly with respect to the change in the control signal.

14. An electronic apparatus comprising:
the oscillator according to claim 13.

15. A moving object comprising:
the oscillator according to claim 13.

16. An oscillator comprising:
an oscillation circuit that includes a variable capacitance element and whose oscillation frequency changes based on a voltage that is applied to the variable capacitance element; and
a voltage generation unit that generates the voltage which is applied to the variable capacitance element based on a control signal, wherein:
the control signal is an analog signal,
the voltage generation unit includes
an A/D conversion circuit that converts the control signal into a digital signal, and
a D/A conversion circuit that converts the digital signal converted by the A/D conversion circuit into the voltage that is applied to the variable capacitance element, and
wherein the D/A conversion circuit converts the digital signal converted by the A/D conversion circuit into the voltage that changes nonlinearly with respect to the change in the digital signal.

* * * * *